United States Patent
Roozeboom et al.

(10) Patent No.: US 11,199,363 B2
(45) Date of Patent: Dec. 14, 2021

(54) METHOD FOR REMOVING A CONTAMINATION LAYER BY AN ATOMIC LAYER ETCHING PROCESS

(71) Applicant: Carl Zeiss SMT GmbH, Oberkochen (DE)

(72) Inventors: Fred Roozeboom, Eindhoven (NL); Dirk Heinrich Ehm, Beckingen (DE); Andrea Illiberi, Leuven (BE); Moritz Becker, Aalen (DE); Edwin Te Sligte, Waarte (NL); Yves Lodewijk Maria Creijghton, Delft (NL)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 16/734,650

(22) Filed: Jan. 6, 2020

(65) Prior Publication Data
US 2020/0142327 A1 May 7, 2020

Related U.S. Application Data

(63) Continuation of application No. PCT/EP2018/067878, filed on Jul. 3, 2018.

(30) Foreign Application Priority Data

Jul. 6, 2017 (DE) ............ 10 2017 211 539.4

(51) Int. Cl.
*G03F 7/20* (2006.01)
*F28D 1/03* (2006.01)
(Continued)

(52) U.S. Cl.
CPC .......... *F28D 1/0375* (2013.01); *F28F 9/0246* (2013.01); *F28F 9/0265* (2013.01);
(Continued)

(58) Field of Classification Search
CPC ................................................ G03F 7/70925
See application file for complete search history.

(56) References Cited

U.S. PATENT DOCUMENTS

| 2006/0175558 | A1* | 8/2006 | Bakker | ............... | G03F 7/70916 |
| | | | | | 250/492.2 |
| 2007/0069162 | A1* | 3/2007 | Banine | ................ | G03F 7/70916 |
| | | | | | 250/504 R |

(Continued)

FOREIGN PATENT DOCUMENTS

| DE | 102009001488 A1 | 11/2009 |
| DE | 102011083461 A1 | 3/2013 |

(Continued)

OTHER PUBLICATIONS

International Search Report and the Written Opinion, PCT/EP2018/067878, dated Sep. 17, 2018, 12 pages.
(Continued)

*Primary Examiner* — Steven Whitesell Gordon
(74) *Attorney, Agent, or Firm* — Edell, Shapiro & Finnan LLC

(57) ABSTRACT

A method for at least partially removing a contamination layer (24) from an optical surface (14a) of an optical element (14) that reflects EUV radiation includes: performing an atomic layer etching process for at least partially removing the contamination layer (24) from the optical surface (14a), which, in turn, includes: exposing the contamination layer (24) to a surface-modifying reactant (44) in a surface modification step, and exposing the contamination layer (24) to a material-detaching reactant (45) in a material detachment step. The optical element (14) is typically taken, before the atomic layer etching process is performed, from an optical arrangement, in particular from an EUV lithography system, in which the optical surface (14a) of the optical element (14)

(Continued)

is exposed to EUV radiation (6), during which the contamination layer (24) is formed.

23 Claims, 3 Drawing Sheets

(51) Int. Cl.
| | |
|---|---|
| F28F 9/02 | (2006.01) |
| H01M 10/663 | (2014.01) |
| H01M 10/625 | (2014.01) |
| H01M 10/65 | (2014.01) |
| F28D 21/00 | (2006.01) |
| F28F 9/22 | (2006.01) |
| H01M 8/04007 | (2016.01) |

(52) U.S. Cl.
CPC .......... *F28F 9/0273* (2013.01); *G03F 7/70925* (2013.01); *F28F 9/0278* (2013.01); *F28D 1/03* (2013.01); *F28D 2021/008* (2013.01); *F28D 2021/0028* (2013.01); *F28D 2021/0043* (2013.01); *F28F 2009/224* (2013.01); *H01M 8/04067* (2013.01); *H01M 10/625* (2015.04); *H01M 10/65* (2015.04); *H01M 10/663* (2015.04); *H01M 2220/20* (2013.01); *H01M 2250/20* (2013.01)

(56) References Cited

U.S. PATENT DOCUMENTS

| | | | | |
|---|---|---|---|---|
| 2007/0145297 | A1* | 6/2007 | Freriks | G03F 7/70925 250/492.2 |
| 2009/0061327 | A1 | 3/2009 | Sengupta et al. | |
| 2009/0260654 | A1* | 10/2009 | Geuppert | G03F 7/70808 134/1.1 |
| 2009/0309045 | A1* | 12/2009 | Metzmacher | G03F 7/70916 250/492.1 |
| 2011/0048452 | A1 | 3/2011 | Zink et al. | |
| 2011/0192820 | A1* | 8/2011 | Yeom | H01J 37/32357 216/67 |
| 2011/0279799 | A1 | 11/2011 | Singer et al. | |
| 2013/0118895 | A1 | 5/2013 | Roozeboom et al. | |
| 2013/0186430 | A1 | 7/2013 | Ehm et al. | |
| 2014/0211178 | A1 | 7/2014 | Ehm et al. | |
| 2016/0203995 | A1 | 7/2016 | Kanarik et al. | |
| 2018/0182597 | A1* | 6/2018 | Blomberg | H01L 21/32135 |

FOREIGN PATENT DOCUMENTS

| | | |
|---|---|---|
| DE | 102014222534 A1 | 12/2015 |
| WO | 2006137014 A1 | 12/2006 |
| WO | 2009059614 A1 | 5/2009 |
| WO | 2010088194 A2 | 8/2010 |
| WO | 2012143446 A1 | 10/2012 |

OTHER PUBLICATIONS

Mameli et al., "New physico-chemical approaches in Area-selective Atomic Layer Deposition and Atomic Layer Etching: the case of ZnO", 2018, 2 pages.
Vitos et al., "The surface energy of metals" Surface Science, vol. 411, Issues 1-2, Aug. 11, 1998, 2 pages.
Kim et al., "Surface energy and polarity of treated indium-tin-oxide anodes for polymer light-emitting diodes studies by contact-angle measurements", Journal of Applied Physics, 86, (1999), 2 pages.
Creyghton et al., "Developments in plasma enhanced spatial ALD for high throughput applications [3.04]", Session 3-ADL, CVD, and Atmospheric Plasma Processes, 2016, 5 pages.
Wu et al., "Low-Temperature Etching of Cu by Hydrogen-Based Plasmas", Applied Materials & Interfaces, vol. 2, No. 8, 2010, 5 pages.
Granneman et al., "3D Pattern Effects in RTA Radiative vs Conductive Heating", ASM, 2006, 29 pages.
Choi et al., "Chemical Etching and Patterning of Copper, Silver, and Gold Films at Low Temperatures", ESC Journal of Solid State Science and Technology, 4 (1), (2015), 10 pages.
German Office Action, Application 10 2017 211 539.4, with English Translation, dated Feb. 1, 2018, 6 pages.

* cited by examiner

METHOD FOR REMOVING A CONTAMINATION LAYER BY AN ATOMIC LAYER ETCHING PROCESS

CROSS-REFERENCE TO RELATED APPLICATION

This is a Continuation of International Application PCT/EP2018/067878, which has an international filing date of Jul. 3, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 211 539.4 filed on Jul. 6, 2017.

FIELD OF THE INVENTION

The invention relates to a method for at least partially removing a contamination layer from an optical surface of an optical element that reflects EUV radiation.

BACKGROUND

To produce microstructured or nanostructured devices of microelectronics or microsystem technology using optical lithography, optical arrangements in the form of projection exposure apparatuses are used. Such projection exposure apparatuses include an illumination system for illuminating a photomask (reticle) with light of a narrow spectral range around an operating wavelength. Said apparatuses furthermore include a projection-optical system for projecting a structure of the reticle onto a light-sensitive layer of a wafer using the light.

In order to attain the smallest possible structure width for the semiconductor devices to be produced, state-of-the-art projection exposure apparatuses, also known as EUV lithography apparatuses, are designed for an operating wavelength in the extreme ultraviolet (EUV) wavelength range, i.e. in a range from approx. 5 nm to approx. 20 nm. Since wavelengths in this range are strongly absorbed by just about all materials, no transmissive optical elements can typically be used, and reflective optical elements must be used instead. Such optical elements that reflect EUV radiation can be, for example, mirrors, reflectively operating monochromators, collimators or photomasks. Since EUV radiation is also strongly absorbed by air molecules, the beam path of the EUV radiation is arranged within a vacuum chamber.

Optical elements that reflect EUV radiation can also be used in other optical arrangements (EUV lithography systems) that are used in connection with EUV lithography. Examples of these are metrology systems for examining exposed wafers or wafers that are to be exposed, for examining reticles, and for examining further components of EUV lithography apparatuses, such as mirrors.

Hydrogen is frequently used in the vacuum chambers of EUV lithography systems as a purge gas and for cleaning. Under the vacuum conditions that prevail there, a hydrogen plasma is produced in the respective vacuum chamber under the action of the EUV radiation. If hydrogen ions and/or hydrogen radicals of the plasma react with materials that are present in the vacuum environment and contain chemical elements that form volatile hydrides under vacuum conditions, so-called hydrogen-plasma-induced outgassing products are formed.

These outgassing products, or the chemical elements of said outgassing products, can deposit on the optical surfaces of EUV mirrors in typically very thin contamination layers, which results in transmittance losses of the respective EUV lithography system and may even lead to imaging errors.

In the EUV mirrors used today, the uppermost layer of a reflective coating is typically a capping layer, which serves to protect the layer(s) of the reflective coating underneath it against oxidation. The capping layer can be formed, for example, from ruthenium. This is critical in particular if chemical elements such as Zn, Sn, P and Si deposit on the surface of such a capping layer in the form of contamination layers, because said chemical elements cannot typically be removed again from the optical surface under the regular environment or operating conditions of an EUV lithography system, i.e. in the presence of hydrogen radicals and hydrogen ions in the environment.

It has been shown that Sn contaminations on EUV mirrors can be removed efficiently with what is known as atomic hydrogen, i.e. with hydrogen radicals, hydrogen ions and/or with molecular hydrogen in an excited electron state. The atomic hydrogen can be obtained using EUV radiation by way of dissociation from molecular hydrogen. In addition, a dissociation device, for example a filament, can be arranged in the vacuum chamber of the EUV lithography system for splitting molecular hydrogen into atomic hydrogen.

However, when using atomic hydrogen for cleaning optical surfaces, two disadvantages arise: First, a lack of control as to when the cleaning process is terminated, which is why so-called over-cleaning typically occurs, which results in an enormous amount of (excess) hydrogen radicals at the surface. The hydrogen radicals can result e.g. in the formation of blisters in the layers of a reflective coating that is applied to a substrate of the optical element. Since the blister formation may result in a delamination of layers of the reflective coating, the risk of damage to the reflective coating consequently increases. On the other hand, contaminations from specific chemical elements, e.g. Zn/Sn or Si, form alloys with the material of the capping layer, e.g. Ru, that cannot be disintegrated by cleaning the surface with atomic hydrogen and be removed therefrom.

It is possible to use, in place of a capping layer made of ruthenium, a capping layer or a capping layer system which contains oxidic materials, e.g. $ZrO_2$, from which the contaminations may be easier to remove or on which the contaminations do not deposit in the first place because they do not bond with the $ZrO_2$. However, the use of oxidic materials for the capping layer generally results in a loss of reflectance of the optical element. In addition, no stable material for the capping layer is currently known which prevents the adhesion of Si as a contaminating material.

WO 2009/059614 A1 describes a method for at least partially removing a contamination layer from an optical surface of an optical element that reflects EUV radiation. In the method, a cleaning gas which preferably contains atomic hydrogen is brought into contact with the contamination layer. A signal that is indicative of the thickness of the contamination layer is also used as a feedback signal for cleaning.

SUMMARY

It is an object of the invention to provide a method of the type mentioned in the introductory section, which has the lowest possible damaging influence on the reflective optical element. It is a further object to provide a method that allows in particular the removal of contaminating materials that adhere strongly to the optical surface.

These objects are achieved by a method of the type mentioned in the introductory section, in which an atomic layer etching process (ALE process or ALEt process) is performed to remove the contamination layer at least partially, preferably completely, wherein performing the atomic layer etching process comprises: exposing the contamination layer to at least one surface-modifying reactant in a surface modification step, and, exposing the contamination layer to at least one material-detaching reactant in a material detachment step.

According to one formulation of the invention, it is proposed to use an atomic layer etching process to remove contamination layers that are at least partially formed from a chemical element that cannot be removed from an optical surface of a reflective optical element by conventional cleaning methods, e.g. by cleaning with atomic hydrogen.

In an atomic layer etching process, an alternating sequence or a cycle of two process steps (A/B/A/B/ . . . ), of three process steps (A/B/C/A/B/C/ . . . ) or of more process steps is typically performed, wherein in the case of two process steps, a first step represents a surface modification step and a temporally subsequent second step represents an etching or material detachment step. The two or possibly more successive steps can be performed one after another in one and the same process reactor (conventional ALE method).

In the surface modification step, the reflective optical element, or specifically at least the surface of the contamination layer, is exposed to a/at least one surface-modifying reactant, also referred to as a chemical precursor, which changes the surface of the contamination layer. The change can be effected for example by chemosorption, i.e. by dissolving chemical bonds in the contamination layer or in sublayers of the contamination layer or by a (pre-) oxidation of chemical elements such as Sn, etc., which has a lower surface energy in the oxidized state than does metallic Sn. This, in turn, means that $SnO_x$ is easier to detach than is metallic Sn.

After the first step, i.e. the surface modification step, the excess precursor or the surface-modifying reactant is removed from the process reactor, specifically generally pumped off or flushed away. In the second, material-detachment step, the contamination layer or the surface thereof is typically exposed to a/at least one material-detaching reactant in the form of a high-energetic species (free radicals, ions, photons) that detaches the chemically weakened uppermost layer(s) of the contamination layer. For example, hydrogen radicals or hydrogen ions, as reducing species, can effect a reduction of the surface that was (pre-) oxidized in the previous, first step or of the materials present there. In this way, the (pre-)oxidized material is detached and can pass into the chamber of the process reactor. The waste products formed here are removed from the chamber of the process reactor after the second step is complete, typically by extracting them by suction or by purging the chamber.

In one variant, the optical element is taken, before the atomic layer etching process is performed, from an optical arrangement, in particular from an EUV lithography system, for example an EUV lithography apparatus or an EUV metrology system, in which the optical surface of the reflective optical element is exposed to EUV radiation. The atomic layer etching process can generally not be performed in-situ, i.e. not within the optical arrangement in which the optical element is impinged upon by EUV radiation or is exposed to EUV radiation. However, in a spatial atomic layer etching process, this may be possible nevertheless. The atomic layer etching process can be effected for example using two or more nozzles or cleaning heads which are arranged for example in a (main) housing of the EUV lithography system. The two or more cleaning heads can supply pulsed streams of gas, containing hydrogen and oxygen or other oxidizing or reducing gases, in alternating fashion to the optical surface of the reflective optical element. It is advantageous if the (local) streams of $O_2$ and $H_2$ gas are supplied to the optical surface substantially under atmospheric pressure. It is likewise advantageous if a laminar gas flow is formed at the optical surface of the reflective optical element. As long as the cleaning heads are appropriately arranged and appropriate gas flows are selected, an atomic layer etching process may also be performed during the operation of the EUV lithography system. When performing the atomic layer etching process in-situ, it is, however, typically necessary to isolate the region in which the atomic layer etching process is performed from the environment with respect to gas pressure and gas hydrodynamics. It is also possible for the gas flow and the electrical and/or thermal conductivity of the plasma that is prevailing in the vacuum environment to be disturbed by the local streams of gas.

It is therefore advantageous to design the optical arrangement, in particular the EUV lithography system, such that the reflective optical element is replaceable, i.e. such that it can be taken from the optical arrangement and replaced by a new reflective optical element without great structural complexity. Removal of the reflective optical element is typically performed when the thickness of the contamination layer has become so great that the transmittance or possibly the imaging properties of the optical arrangement has/have significantly deteriorated so as to make replacing the reflective optical element by a "new" reflective optical element (without contamination layer) necessary. The reflective optical element taken from the optical arrangement is "refurbished" using the atomic layer etching process and can be reused in the same optical arrangement or in a different optical arrangement after the generally complete removal of the contamination layer. With the atomic layer etching it is also possible to remove from the optical surface of a reflective optical element contaminants which are "non-cleanable" per se and which were formed in the vacuum atmosphere of the optical arrangement.

In a further variant, the atomic layer etching process is performed in an atomic layer etching apparatus. The atomic layer etching apparatus can be, for example, a conventional apparatus for atomic layer etching or for reactive ion etching, which includes a process reactor or a process chamber in which the atomic layer etching process is performed. The two process steps which were described further above are repeated multiple times in such a process chamber until the contamination layer is at least partially, generally completely stripped away. The atomic layer etching process in the process chamber makes possible a gentle treatment of the optical element, because in one cycle, i.e. in two process steps, only a very small number of layers of the contamination layer are stripped away. In order to check whether the entire contamination layer has been stripped away, one or more sensors can be provided in the atomic layer etching apparatus. For example, a residual gas analyser or a mass spectrometer can be used to detect which chemical elements have been released during the atomic layer etching process. Since the mass spectrometer, or the detector thereof, is generally operated under vacuum conditions, the use of a mass spectrometer is simpler for a conventional atomic layer etching process, which is performed under vacuum conditions, than for a spatial atomic layer etching process, which is generally performed at atmospheric pressure. In the case of a spatial atomic layer etching process, suitable pressure conditions can be set at the mass spectrometer, or the detector thereof, e.g. by differential pumping.

If a chemical element which is contained in a layer, for example a capping layer, that is located underneath the contamination layer is detected by the mass spectrometer, the atomic layer etching process can typically be terminated because the contamination layer has been substantially completely removed from the surface. It is to be understood that the atomic layer etching process can also be monitored in different ways, for example using optical sensors, for example to identify when the atomic layer etching process is to be terminated. Moreover, the effective thickness of the residual contamination layer (either island-like(non-close, or continuous/closed) can be monitored by optical detection, e.g. by spectrometric ellipsometry ex situ in an ALE compartment or—ideally in-situ, real-time as an endpoint detection method.

As in the case of classical etching, the specific chemical affinity between the etching (evaporating) reactant and the contamination (e.g. a metal) offers an intrinsic type of material-dependent etching selectivity. For this reason, in the case of a contamination layer having a thickness which varies in a locally dependent manner, the material located underneath the contamination layer is not stripped away, possibly not even in partial regions of the contamination layer of a lower thickness, which are stripped away completely.

Even in the case of a contamination layer having a thickness which varies in a location-dependent manner, the atomic layer etching process may be controlled or regulated such that a greater etching removal is effected in partial regions of the contamination layer that have a greater thickness than in partial regions of the contamination layer that have a lower thickness, in particular in a spatial atomic layer etching process (see below). In a conventional atomic layer etching process, flattening of the thickness profile of the contamination layer typically occurs in any case, for the following reasons: First, a portion of the contaminating material (e.g. $SnH_4$) which has just been etched or evaporated, but not been pumped off or purged, in a hydrogen reducing step, a methylation step, etc., can re-deposit again on the thinner partial regions of the contamination layer. In addition, better wetting of the oxidized contamination layer occurs in the oxygen pre-oxidation or re-oxidation step as compared to the material on the optical surface, which is generally a non-oxidized metal, e.g. ruthenium. The better wetting of the material of the capping layer is a consequence of the fact that metal oxides have a lower surface energy than their corresponding metals.

In principle, a thermal atomic layer etching process in which e.g. hydrogen radicals form the active species therefore produces an isotropic etching profile. An atomic layer etching process with an anisotropic etching profile can be produced for example by producing a plasma in the environment of the optical element, for example by "biasing" the substrate or the optical element using a high-frequency alternating electromagnetic field, which also results, in addition to many randomly propagating free radicals, in the production and acceleration of a small portion of ions in the direction of the optical surface. Due to the ions, the process cycle is given a directionality, with the consequence that horizontal portions of the contamination layer are typically etched slightly more strongly than vertical portions of the contamination layer.

In a further variant, the atomic layer etching process is performed as a spatial atomic layer etching process. In spatial atomic layer etching ("spatial ALE"), which is also known as "fast" ALE, the two process steps or rather the process gases of the two process steps are conducted/guided over and in close proximity of the surface of the contamination layer or of the reflective optical element in zones or regions which are spatially separated from one another. For this purpose, an atomic layer etching head can be used, which is moved relative to the surface, as is described by way of example in US 2013/0118895 A1 or in DE 10 2014 222 534 A1, the entire disclosure of which is incorporated by reference in the content of this application.

In a further variant, the contamination layer contains at least one chemical element selected from the group comprising: Zn, Sn, P, As, B, Si, In, Pb, Mg, Na, Ge, (semi-)noble metals, in particular Cu, Ag, and Au. As was described further above, these materials can form highly volatile hydrides with $H_2$ and $CH_4$ based plasmas, which means that these materials transition into the gas phase in the presence of atomic hydrogen. In addition, said materials generally form low-volatility chemical compounds (e.g. alloys) with the material of the optical surface, which means that these materials cannot be removed or cannot be removed without difficulty from the optical surface using in-situ hydrogen cleaning. Highly volatile hydrides are formed e.g. by As in the reaction As→$AsH_3$, boron in the reaction B→$BH_3$, or phosphorus in the reaction P→$PH_3$. Apart from group IV elements such as Si, Ge, Sn, also metals, e.g. (semi-)noble metals like Cu, Ag, and Au, may be removed/evaporated in a reducing-oxidizing cycle. Some metals form volatile complexes with specific organic compounds such as acetylacetone, being used as a surface-modifying reactant, in combination with a surface-modifying reactant such as oxygen or another high-energetic species in an ALE process (see below).

In a further variant, the contamination layer is at least partially removed from a capping layer of a reflective coating of the reflective optical element. The capping layer of the reflective coating can contain in particular Ru or consist of Ru, in particular if the reflective coating is a multilayer coating which is to be protected by the capping layer against oxidation. However, it is to be understood that cleaning can also be effected on a reflective coating of what is known as a "grazing-incidence" mirror, in which the reflective coating does not necessarily have a plurality of alternating layers with different refractive indices.

In a further variant, a surface modification step using oxygen as the surface-modifying reactant and preferably a material detachment step using hydrogen as the material-detaching reactant are performed in the atomic layer etching process. Such a surface modification step, in which the material on the surface of the contamination layer is at least partially oxidized, is typically followed by a reduction step, in which the material, which was oxidized in the previous step, is reduced in the second step for example using hydrogen as the process gas for detaching the material from the surface.

Such a redox reaction can be used advantageously in particular in an atomic layer etching process in which the contamination layer contains tin (Sn) as the contaminating material: It has been found in the case of the (continuous) cleaning with hydrogen radicals that the cleaning rate is significantly higher for Sn that is present on the surface in oxidized form than in the case of cleaning of Sn that is present on the surface in metallic form, i.e. oxidized tin was removed significantly faster from the surface than metallic tin. The redox reduction can be performed in particular using a spatial ALE process (not only in the case of tin as the contaminating substance) to maximize the process speed. However, it is to be understood that other mechanisms of action than an oxygen-hydrogen-based redox reaction can be used in atomic layer etching, which are generally likewise based on a redox reaction, as will be described below. Also, extra process steps "C" may be included into the sequence (A/B/A/B/ . . . ), leading to a sequence of three process steps A/B/C/A/B/C/ . . . . The third step "C" may be an extra volatilizing or an extra surface-modification step, making the removal of contaminants even more effective by a triple (or quadruple, . . . ) ALE sequence.

In one variant, in atomic layer etching, a surface modification step is performed with a hydrocarbon, for example with methane, and/or with a halogen, in particular with chlorine, and a material detachment step is preferably performed with hydrogen as the material-detaching reactant. One example of such an atomic layer etching process in which methylation or halogenation, in particular chlorination, on copper is described, is presented in the article "Chemical Etching and Patterning of Copper, Silver, and Gold Films at Low Temperatures" by T.-S. Choi and D. W. Hess, ECS J. Solid State Sc. and Technol., 4(1), N3084 (2015) and in the article "Low-Temperature Etching of Cu by Hydrogen-Based Plasmas" by F. Wu, G. Levitin and D. W. Hess, ACS Appl. Materials and Interfaces, 2(8), 2175 (2010), the entirety of which is incorporated into the content of this application by reference.

In the atomic layer etching process on copper described in the cited articles, first, i.e. in a first step, a (mild) chlorination of Cu in $CuCl_2$ is performed. Performed subsequently in a second step, for example in an argon-hydrogen plasma, is the reduction and ion-assisted evaporation of $Cu^{II}Cl_2$ to $Cu_3^{I}Cl_3$. Instead of a chlorination, it is also possible (maybe preferred) to perform a methylation in the first step. Analogously to the reaction mechanism of copper, which was described further above, it is possible to perform in the first step a chlorination or methylation of a different material, for example of tin (Sn), which is followed by the above-described $Ar-H_2$ plasma detachment step for volatilization or evaporation of the corresponding tin compound.

In a further variant, in the atomic layer etching, a surface modification step using an organic compound, preferably using a β-diketone, in particular acetylacetone, as the surface-modifying reactant and preferably a material detachment step using oxygen as the material-detaching reactant are performed in the atomic layer etching. One example of such an atomic layer etching process in which a surface modification step using acetylacetone (i.e. a β-diketone) and a material detachment step using oxygen on ZnO is described, is presented in the article "New physico-chemical approaches in Area-selective Atomic Layer Deposition and Atomic Layer Etching: the case of ZnO", A. Mameli et al., in: Proceedings of the International Conference on Coatings on Glass and Plastics, ICCG 12, TU Wuppertal, June 2018, Technical Session 2: Atmospheric pressure processes. In this article, it is described that the acetylacetone, resp., the acetylacetate anion (acac), forms a volatile complex with Zn by metal oxide surface chelation (e.g. $Zn(acac)_2$). As many other metals can form a volatile complex with acetylacetone (to form metal acetylacetonates), resp. with β-diketones (to form metal β-diketonates), the atomic layer etching process described in the article cited above may be applied for removing other metal contaminants as well. Other organic compounds may also be used as metal-detaching reactants, e.g. forming volatile metal complexes such as β-diketiminates, carboxylates, amidinates, alkoxides or amides.

The surface modification step and/or the material detachment step of the atomic layer etching processes, which were described further above, are preferably performed in plasma-assisted fashion, but can alternatively or additionally also be performed in temperature-assisted fashion. However, good etching selectivity may already be attained at room temperature.

In a further variant, the plasma is generated in an atomic layer etching head, preferably at a pressure between 100 mbar and 2000 mbar. For spatial ALE, preferably high gas pressures are used, typically in the range specified above, i.e. near atmospheric gas pressure, as high gas pressures are advantageous for effectively separating the surface modification (e.g. oxidative) step and the spatially separated material-detaching (e.g. reductive) step. When plasma is needed/ used for generating oxygen radicals and/or hydrogen radicals in the successive redox steps, at the pressures indicated above, the plasma radicals recombine extremely fast on the surrounding surface(s) and in the gas phase. Therefore, it is advantageous to generate the plasma as close as possible from the contamination layer, resp., from the substrate/optical surface of the optical element, e.g. in the atomic layer etching head.

In a preferred variant, the plasma is generated in a dielectric barrier discharge plasma source of the atomic layer etching head. Given the high pressures indicated above, vacuum based plasma sources commonly used in semiconductor processing cannot be used, so that atmospheric pressure plasma technology is needed, e.g. based on microwave technology or Dielectric Barrier Discharges (DBD). Using a DBD plasma is advantageous, as it can be generated very close to the surface of the contamination layer, thus increasing the radical yield, i.e. the etch rate. Typical distances in the range between 0.02 mm to 0.2 mm are preferred, corresponding to the preferred distance between the atomic layer etching head and the surface of the contamination layer to guarantee proper gas separation. According to experimental findings, the DBD plasma is advantageously generated very proximate to the optical surface without electrically interacting with the optical surface. In other words, the substrate, resp., the optical element should not be used as an electrode or as an electrical capacitive element (dielectric barrier) in the plasma generating process. Thus, both the electrodes and the dielectric barrier should be integrated into the DBD plasma source of the atomic layer etching head.

For instance, two cylindrical electrodes with a cylindrical dielectric barrier arranged in-between may be used as a DBD plasma source integrated in a first/second supply device of the atomic layer etching head. The surface-modifying reactant, resp., the layer-detaching reactant may pass through the space between the electrodes of the first/ second supply device. In this way, the (relative) distance between the optical surface of the optical element and the dielectric barrier of the DBD plasma can be kept in the range of between 0.02 mm and 0.2 mm indicated above. Implementation details of DPD plasma sources suitable for use in ALE are described in the article "Developments in plasma enhanced spatial ALD for high throughput applications", Y. Creyghton et al., Proc. Int. Conf. on Coatings on Glass and Plastics (ICCG 2016), Braunschweig, Germany, Jun. 12-16, 2016, pp. 93-97, which is incorporated herein by reference in its entirety.

In a further variant, the surface modification step uses oxygen as the surface-modifying reactant, which is supplied to the contamination layer in the form of a gas composition comprising at least one of $O_2$, $N_2O$, $H_2O$, $H_2O_2$ added to a carrier gas. Preferably, the gas composition/mixture comprises a fraction of 0.5% (vol.) to 5% (vol.) of $O_2$, resp., of the $O_2$-containing species in a (plasma) carrier gas, e.g. $N_2$, Ar, He, Xe, . . . to form OH radicals.

In another variant, the material detachment step uses hydrogen as the material-detaching reactant, being supplied to the contamination layer in the form of a gas composition comprising at least one of $H_2$, $NH_3$ or hydrocarbons added to a carrier gas. Preferably, the gas composition/mixture comprises a fraction of 5% (vol.) to 50% (vol.) of $H_2$, resp., of the $H_2$-containing species in a (plasma) carrier gas, e.g. $N_2$, Ar, He, Xe, . . . to form H radicals.

In a further variant, as part of the atomic layer etching process, between a surface modification step and a material detachment step, a temperature change is preferably performed at a rate of more than +/−50 K/s, in particular more than +/−100 K/s. If the temperature can be modulated quickly enough, for example at a rate of increase of several +100 K/s and a rate of decrease of several −50 K/s starting from a nominal base or plateau temperature of the atomic layer etching process, which is typically between room temperature and +200° C., as is used in conventional atomic layer processes, the temperature change can be synchronized with the switch-on and the switch-off rate of the oxidizing agent and of the reducing agent or of the removing agent. In this way, the oxidation due to oxygen, chlorinating and/or methylating agents or gases can be performed in the surface modification step and the detachment of atomic layers due to reducing or surface-layer-detaching agents or gases can be achieved in the material detachment step. Atomic layer processes in general, i.e. not just atomic layer etching processes but also atomic layer deposition processes, can be provided with the above-described fast temperature modulation so as to be able to use the process windows of conventional atomic layer processes (without temperature change). For the temperature change, heating devices e.g. in the form of radiant heaters and cooling devices, e.g. in the form of Peltier elements can be used to rapidly change the temperature on the relevant surface. In addition or alternatively to heating by way of radiant heating, it is also possible to produce a quick temperature change by way of heat transfer in the form of conduction, for example by using hot and cold gas streams in alternation in the atomic layer etching, cf. also the article "3D Pattern Effects in RTA Radiative vs Conductive Heating", E. H. Granneman et al., ECS Trans. 2006 3(2): 85-96. This is favourable in particular in the case of a spatial atomic layer etching process in which the distance or the gap between the gas inlets or the supply devices and the contamination layer is of the order of magnitude of approximately 100 μm, such that high rates of temperature change can be achieved by way of conduction. In the heat transfer by conduction, it is in particular advantageous if the streams of gas contain He or $H_2$, because these are gases having the highest heat capacity. The gases or the streams of gas can be heated for example using heating devices in the form of metallic heating coils, which are mounted at the gas inlets or the supply devices of an atomic layer etching head for spatial atomic layer etching or surround the inlets.

Further features and advantages of the invention emerge from the following description of exemplary embodiments of the invention, with reference to the figures of the drawing, which show details essential to the invention, and from the claims. The individual features may be realized in each case individually by themselves or as a plurality in any desired combination in a variant of the invention.

BRIEF DESCRIPTION OF THE DRAWINGS

Exemplary embodiments are represented in the schematic drawing and are explained in the following description. In the drawing.

DETAILED DESCRIPTION

In the following description of the drawings, identical reference signs are used for identical or functionally analogous components.

Figure 1:
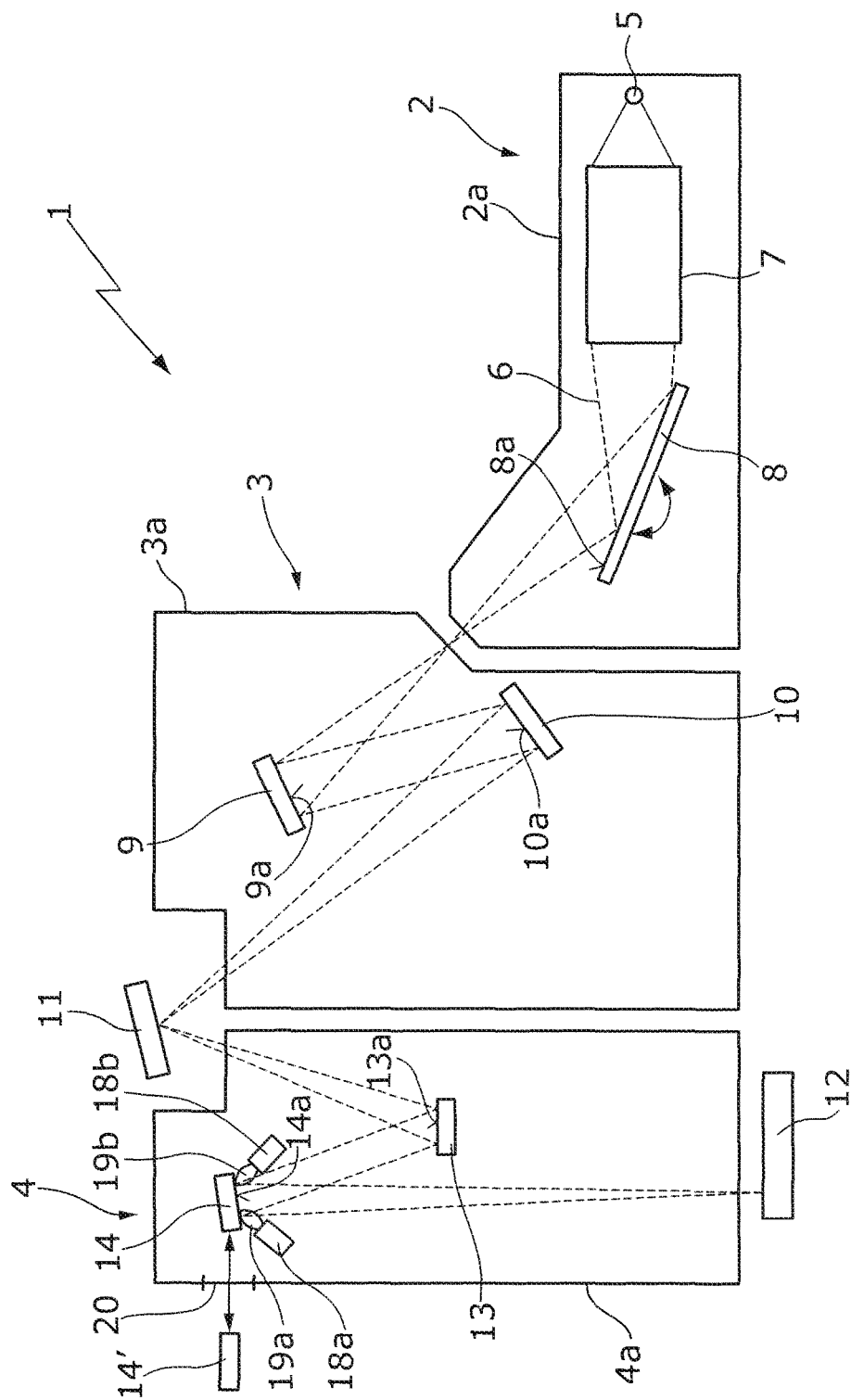
FIG. 1 shows a schematic illustration of an EUV lithography apparatus having a plurality of reflective optical elements, of which one is taken from the EUV lithography apparatus.

FIG. 1 schematically shows an EUV lithography apparatus 1, which has a beam-shaping system 2, an illumination system 3 and a projection system 4, which are accommodated in separate vacuum housings 2*a*, 3*a*, 4*a* and are arranged successively in the beam path of EUV radiation 6, which emanates from an EUV light source 5 of the beam-shaping system 2. A plasma source or a synchrotron can serve for example as the EUV light source 5. The radiation emerging in the wavelength range between about 5 nm and about 20 nm is first concentrated in a collimator 7. With the aid of a downstream monochromator 8, the desired operating wavelength is filtered out by variation of the angle of incidence, as is indicated by a double-headed arrow. In the stated wavelength range, the collimator 7 and the monochromator 8 are usually embodied as reflective optical elements, wherein at least the monochromator 8, on its optical surface 8*a*, has no multilayer system, in order to reflect a wavelength range having the greatest possible bandwidth.

The EUV radiation 6 manipulated in the beam-shaping system 2 with regard to wavelength and spatial distribution is introduced into the illumination system 3, which has a first and a second reflective optical element 9, 10. The two reflective optical elements 9, 10 guide the EUV radiation 6 to a photomask 11 as a further reflective optical element. The photomask 11 has a structure which is imaged onto a wafer 12 at a reduced scale by the projection system 4. For this purpose, a first and a second reflective optical element 13, 14 are also provided in the projection system 4. The reflective optical elements 9, 10, 11, 13, 14 each have an optical surface 9*a*, 10*a*, 11*a*, 13*a*, 14*a*. These optical surfaces are arranged in the beam path of the EUV lithography apparatus 1 and are thus exposed to the EUV radiation 6.

As can be seen in FIG. 1, provided on the second optical element 14 of the projection system 4 is a cleaning unit in the form of two cleaning heads 18*a,b* for directing two cleaning gas jets 19*a,b* containing atomic hydrogen e.g. in the form of hydrogen radicals, ions and/or molecular hydrogen in an excited electron state onto the optical surface 14a of the optical element 14. By cleaning with atomic hydrogen, it is in particular possible to remove carbon contaminations from the optical surface 14a of the optical element 14.

During the cleaning with the atomic hydrogen, the atomic hydrogen also comes into contact with components (not illustrated in the figure) that are arranged in the respective vacuum housing 2a, 3a, 4a and have chemical elements that, in the presence of atomic hydrogen, form highly volatile hydrides. Examples of such elements are tin (Sn), zinc (Zn), phosphorus (P), arsenic (As), boron (B), silicon (Si), lead (Pb), indium (In), magnesium (Mg), sodium (Na) and fluorine (F). The volatile hydrides of these and possibly other chemical elements, such as germanium (Ge), and (semi-) noble metals, in particular copper (Cu), silver (Ag), and gold (Au), gas out of the components, e.g. sensors or the like, which is also referred to as hydrogen-induced outgassing. The corresponding outgassing products which are passed to the vacuum environment deposit on the reflective optical elements 9, 10, 11, 13, 14, more specifically on the optical surfaces 9a, 10a 11a, 13a, 14a thereof, and form a (thin) contamination layer, which cannot be easily removed from the respective optical surface 9a, 10a, 11a, 13a, 14a by atomic hydrogen cleaning.

It may be possible to remove the contamination layer 24 using an atomic layer etching process that is performed in-situ in the EUV lithography apparatus 1. For this purpose, the two cleaning heads 18a,b of the optical surface 14a shown in FIG. 1 can supply, in alternating fashion, in each case a pulsed gas jet 19a,b containing $H_2$ and $O_2$, respectively, or other oxidizing or reducing gases. It is favourable if the (local) streams of $O_2$ and $H_2$ gas 19a,b are supplied to the optical surface 14 substantially at atmospheric pressure, as is typically the case during a break in operation of the EUV lithography apparatus 1, during which the respective housings 2a, 3a, 4a are typically not evacuated. It is likewise advantageous if a laminar gas flow is formed at the optical surface 14a of the reflective optical element 14.

In an in-situ atomic layer etching process such as this, it is, however, typically necessary to isolate the region in which the atomic layer etching process is performed from the remaining (vacuum) environment with respect to gas pressure and gas hydrodynamics. It is also possible for the gas flow(s) and the conductivity of the plasma that is prevailing in the vacuum environment to be disturbed by the local streams of gas 19a,b. Assuming that the cleaning heads 18a,b are appropriately arranged, it is, however, also possible to perform an atomic layer etching process during the operation of the EUV lithography apparatus 1. However, due to the problems which were described further above, it is generally more advantageous if the atomic layer etching process is performed ex-situ, i.e. in an atomic layer etching apparatus 21 which is provided specifically for this purpose and will be described in detail below.

Since the presence of a contamination layer having a thickness which is too great results in a significant reduction of the reflectance of the reflective optical elements 9, 10, 11, 13, 14 and possibly to a deterioration of the imaging properties of the projection system 4, the EUV lithography apparatus 1 shown in FIG. 1 is embodied to allow removal of the reflective optical elements 13, 14 of, at least, the projection system 4. In this way, a respective reflective optical element 14, which has a contamination layer, can be removed from the EUV lithography apparatus 1 and be replaced by a "new" reflective optical element 14', which does not have a contamination layer, as is shown in FIG. 1 by way of example for the second reflective optical element 14 of the projection system 4.

For the replacement of the reflective optical element 14, in the example shown in FIG. 1, an opening 20 that is closable in a vacuum-tight manner is provided in the vacuum housing 4a of the projection system 4. The reflective optical element 14 is accessible from outside the vacuum housing 4a of the projection system 4 through the opening 20 and can be detached from a holder to which the reflective optical element 14 is releasably attached in the vacuum housing 4a, for example by way of a screw connection. After the reflective optical element 14 is detached from the holder, it is taken from the vacuum housing 4a and replaced by the "new" reflective optical element 14', as is indicated in FIG. 1 by way of a double-headed arrow. It is to be understood that such a replacement can also be performed in the case of the other reflective optical elements 9, 10, 11, 13 of the EUV lithography apparatus 1, for which purpose a plurality of openings may be provided in the corresponding vacuum housings 2a, 3a, 4a.

To perform the replacement, it is generally required to break the vacuum in the corresponding vacuum housings 2, 3, 4. The replacement can possibly also be performed by way of a vacuum lock. In this case, the reflective optical element 14 is typically detached from the holder and transported into the vacuum lock using a transport device in automated fashion, from which the reflective optical element 14 can be taken out in automated fashion using a further transport device or possibly be taken out manually and be replaced by the "new" reflective optical element 14'.

Figure 2:
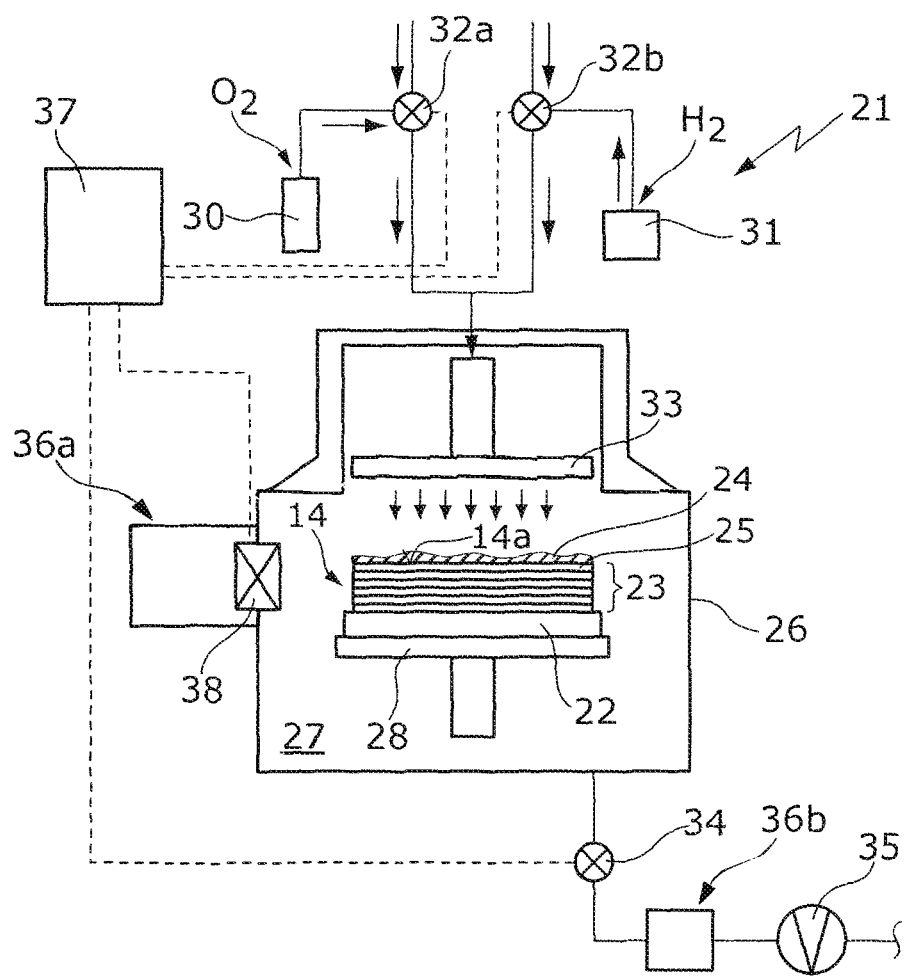
FIG. 2 shows a schematic illustration of an atomic layer etching apparatus with a process chamber in which the optical element is arranged for removing a contamination layer.

The reflective optical element 14 that has been removed from the EUV lithography apparatus 1 is transported manually or possibly likewise in automated fashion into an atomic layer etching apparatus 21, which is shown in FIG. 2, to remove as completely as possible the contamination layer 24, which is illustrated in FIG. 2. The optical element 14, which is shown in detail in FIG. 2, has a substrate 22, on which a reflective multilayer coating 23 is arranged, which has layers of molybdenum and silicon in alternation, the thicknesses of which are matched to one another such that, at the operating wavelength of the EUV lithography apparatus 1 of approximately 13.5 nm, as high a reflectance as possible is achieved. The optical surface 14a is formed on the top side of a capping layer 25 of the reflective coating 23, which in the example shown is made from Ru. As a result of the continuous use of the reflective optical element 14 in the exposure operation of the EUV lithography apparatus 1 of FIG. 1, the contamination layer 24 has formed on the capping layer 25, wherein the contamination layer 24 includes Sn in the example shown, but can also include other chemical elements, e.g. Zn, P, As, B, Si, Pb, In, Mg, Na, F, Ge, metals such as Cu, Ag, Au, etc., which cannot be removed, or can be removed only with great difficulty, in the case of in-situ cleaning in the EUV lithography apparatus 1.

To remove the contamination layer 24 by way of an atomic layer etching process, the atomic layer etching apparatus 21 shown in FIG. 2 has a process chamber 26, in the interior space 27 of which a holder 28 is arranged on which the reflective optical element 14 is stored during the etching process. Both the holder 28 and the walls of the process chamber 26 can be heated to (possibly different) temperatures. The holder 28 can be connected to a motor so as to cause the reflective optical element 14 to perform a rotational movement during the atomic layer etching process. The atomic layer etching apparatus 21 also comprises a container 30, which contains what is known as a precursor or reactant, which is gaseous oxygen $O_2$ in the present example. A further container 31 serves for providing gaseous hydrogen $H_2$, which likewise serves as a reactant in the atomic layer etching process.

Both the oxygen $O_2$ and the hydrogen $H_2$ can be introduced into the process chamber 26 in each case by a controllable inlet in the form of a controllable valve 32a, 32b. Arranged in the process chamber 26 is a distribution manifold 33 for distributing the incoming gas as homogeneously as possible in the direction of the reflective optical element 14. A purge gas, e.g. argon, can also be supplied to the process chamber 26 via the controllable valves 32a, 32b in order to purge the process chamber 26 and the respective supply lines. Another controllable valve 34, which forms a gas outlet, is connected to a vacuum pump 35 for removing the respective gases from the process chamber 26.

To monitor the residual gas atmosphere in the process chamber 26, a first process gas analyser 36a is flange-mounted to the process chamber 26. A second process gas analyser 36b for monitoring the residual gas is arranged in an extracting line behind the outlet valve 34. Both the first and the second process gas analysers 36a, 36b serve for the detection or the determination of the amount or of the partial pressure of at least one gaseous component that is contained in the residual gas atmosphere of the process chamber 26 (or, in the case of the process gas analyser 36b, was contained in the process chamber 26).

For removing the contamination layer 24 from the optical surface 14a of the reflective optical element 14, the following procedure is performed: First, in a surface modification step, the precursor or the surface-modifying reactant in the form of oxygen $O_2$ is supplied to the process chamber 26 via the first valve 32a. At the same time, a plasma is generated in the process chamber 26 by way of a plasma generating device (not illustrated in more detail), for example in the form of a microwave plasma generating device, to amplify the reaction of the oxygen $O_2$ with the Sn on the surface of the contamination layer 24. For the plasma generation, for example the optical element 14 or the holder 28 can be electrically isolated from the rest of the process chamber 26, and a high-frequency alternating electromagnetic field ("HF bias") can be applied to the holder 28. Ions are formed in the plasma which are incident on the contamination layer 24 and in this way amplify the reaction of the oxygen $O_2$ with the Sn on the surface of the contamination layer 24. Due to the oxygen $O_2$, the metallic Sn is converted to $SnO_x$.

Subsequently, the first valve 32a is switched over, and an (inert) purge gas is supplied to the process chamber 26 via the first valve 32a. The latter is extracted together with the residual oxygen $O_2$ and any other gaseous components using the vacuum pumps 35 via the opened exit valve 34.

After purging, the exit valve 34 is closed and, in a material detachment step, hydrogen $H_2$ is introduced into the process chamber 26 via the second valve 32b. The (molecular) hydrogen $H_2$ is converted, by way of the plasma generating device, to hydrogen radicals or hydrogen ions, which react at the exposed surface of the contamination layer 24 with the $SnO_x$ to form a hydride (e.g. $SnH_4$), which detaches from the contamination layer 24 and transitions to the gas phase. It may be possible for the hydrogen $H_2$ to be introduced into the process chamber 26 already in activated form, for example by guiding it past a hot filament. Such a filament or activation device for the hydrogen $H_2$ may also be provided in the process chamber 26 itself. It may also be possible for an inert gas, e.g. argon, to be supplied to the process chamber 26 to amplify the reaction with the activated hydrogen.

After the detachment step, the process chamber 26 is once again purged using the purge gas, which is supplied to the process chamber 26 via the second valve 32b and is extracted together with the residual hydrogen and with the reaction products that formed during the detachment using the vacuum pump 35 when the exit valve 34 is opened. In the above-described cycle, one or more monolayers of the contamination layer 24 is/are stripped away and removed from the optical surface 14a.

After the outlet valve 34 is closed, this cycle is repeated several times, to be precise until the contamination layer 24 has been removed as completely as possible from the optical surface 14a.

The time period during which the oxygen $O_2$ is supplied in the surface modification step, the time period during which hydrogen $H_2$ is supplied in the material detachment step, and the time period of the purging are typically in the region of seconds. A control device 37 serves for actuating the valves 32a, 32b, 34 to switch between the above-described steps of the atomic layer etching process. The control device 37 additionally serves for actuating a further valve 38, which connects the first process gas analyser 36a to the process chamber 26. It is to be understood not only that the control device 37 can switch the valves 32a, 32b, 34, 38 between an open position and a closed position, but also that the mass flow through the respective valves 32a, 32b, 34, 38 can be controlled using the electronic control device 37.

The redox reaction of Sn described in connection with FIG. 2 is particularly advantageous for the removal of the contamination layer 24, because it has been shown that it is significantly easier to detach $SnO_x$ from the contamination layer 24 using hydrogen ions or using hydrogen radicals than is the case with metallic Sn. Complete removal of the contamination layer 24 and thus termination of the atomic layer etching process can be detected by way of the two process gas analysers 36a, 36b, for example when the detected Sn concentration strongly decreases or when the Ru material of the capping layer 25 is detected. For exemplary implementations of the process gas analysers 36a, 36b, reference is made to WO 2009/059614 A1, which was cited in the introductory part and the entirety of which is incorporated into the content of this application by reference.

Figure 3:
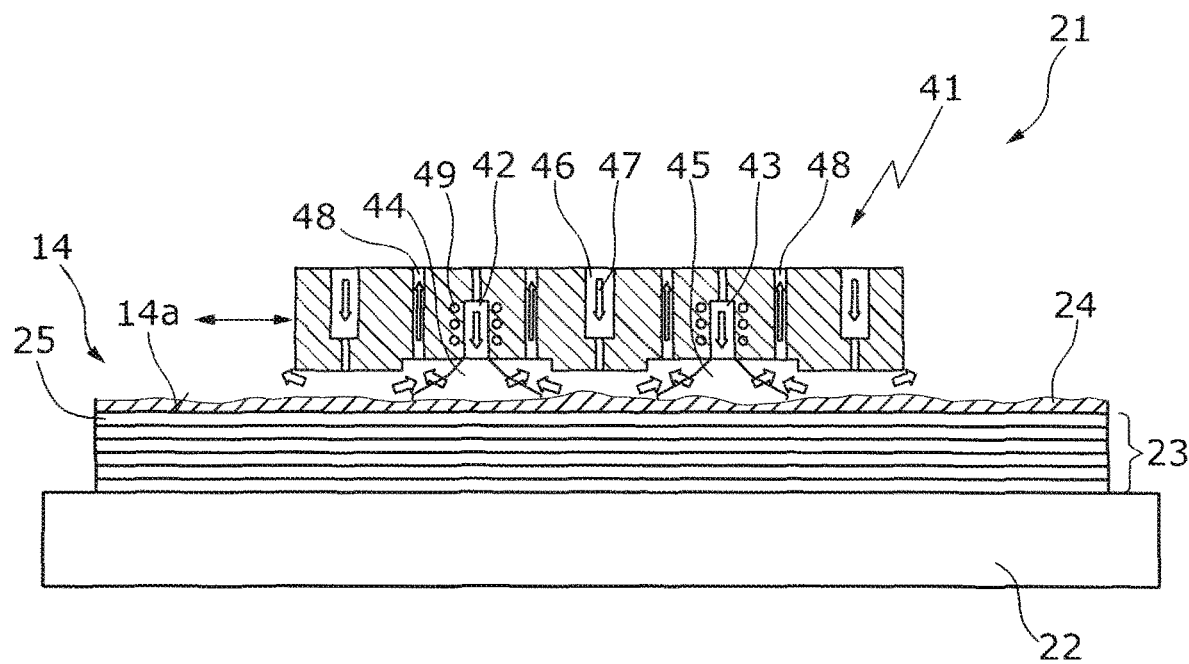
FIG. 3 shows a schematic illustration of an atomic layer etching apparatus in the form of an atomic layer etching head for performing a spatial atomic layer etching process.

While FIG. 2 shows a conventional atomic layer etching apparatus 21, in which the surface modification step and the material detachment step are performed successively in time, in the atomic layer etching apparatus 21 shown in FIG. 3, which has an atomic layer etching head 41, spatial atomic layer etching of the contamination layer 24 is performed. The atomic layer etching head 41 is arranged in a process chamber which is not illustrated in FIG. 3. The atomic layer etching head 41 in the example shown has a first supply device 42 for supplying a surface-modifying reactant 44 to the contamination layer 24 and a second supply device 43 for supplying a layer-detaching reactant 45 to the contamination layer 24. The atomic layer etching head 41 also has purge gas supply devices 46 for supplying an inert purge gas 47 into the intermediate space between the atomic layer etching head 41 and the first and second supply devices 42, 43. The purge gas supply devices 46 can be used to laterally delimit the region in which the surface-modifying reactant 44 is incident on the contamination layer 24 and also the region in which the layer-detaching reactant 45 is incident on the contamination layer 24. Thereafter, the purge gas 47 together with the respective reactants 44, 45 are extracted from the intermediate space between the atomic layer etching head 41 and the contamination layer 24 by way of extraction devices 48.

The purge gas 47 can also serve for producing a floating, i.e. frictionless air bearing facilitated movement of the atomic layer etching head 41 in the manner of an air cushion, such that the atomic layer etching head 41 can be positioned at a desired distance from the optical surface 14a or the contamination layer 24. The desired distance may be in a range from e.g. 0.02 mm to 0.2 mm. For details concerning possible implementations of an atomic layer etching head 41, reference is made to US 2013/0118895 A1, which was cited further above and the entirety of which is incorporated into the content of this application by reference.

The atomic layer etching head 41 can be moved over the surface 14a of the reflective optical element 14 by way of movement devices (not illustrated in more detail), as is indicated by way of a double-headed arrow in FIG. 3. Alternatively or additionally, the optical element 14 can also be moved, in particular displaced, by way of suitable movement devices. The surface modification step by way of the surface-modifying reactant 44 and the layer detachment step by way of the layer-detaching reactant 45 are performed in the example shown in FIG. 3 at the same time at different locations or regions of the contamination layer 24. However, by moving the atomic layer etching head 41 over the optical surface 14a, the surface modification step and the layer detachment step take place in one and the same location of the optical surface 14a in a temporally successive fashion. Since purging by way of the purge gas 47 is also performed at the same time, the time interval between the two successive steps of the atomic layer etching process is also short.

The surface-modifying reactant 44 used in the first surface modification step can be, for example, oxygen or a halogen, in particular chlorine, more specifically chlorine gas. The chlorine gas makes it possible to chlorinate chemical elements present in the contamination layer 24, such as for example Sn, i.e. convert them into a chloride. Alternatively or additionally, the surface-modifying reactant 44 can also be a hydrocarbon, e.g. methane, or a mixture of hydrocarbons so as to effect a methylation of the contaminating substances, e.g. of Sn contained in the contamination layer 24. Alternatively or additionally, the surface-modifying reactant 44 can also be an organic compound, more specifically a β-diketone, for example acetylacetone, reacting with the Sn (or other metals) to form a volatile metal complex by chelation.

In the subsequent layer detachment step, hydrogen $H_2$ is typically used as the reactant 45 to produce layer stripping of one or more atomic layers of the contamination layer 24. Both the first and the second step can be assisted by plasma, e.g. by using a high-frequency electromagnetic alternating field ("HF bias"), a microwave plasma, or a Dielectric Barrier Discharge (DBD). The plasma can be generated in a plasma source which is integrated into the atomic layer etching head 41. In this way, the plasma is generated at a very proximate distance to the contamination layer 24, thus enhancing the radical yield and thus the etch rate, in particular when the pressure in the gap between the atomic layer etching head 41 and the contamination layer 24 is close to atmospheric pressure, e.g. in a range from 100 mbar to 2000 mbar, which allows to effectively separate the reductive and oxidative treatment steps.

In the present example, the atomic layer etching head 41, more specifically the first supply device 42 and the second supply device 43, are both embodied as a Dielectric Barrier Discharge (DBD) plasma source: The supply devices 42, 43 each have two cylindrical electrodes with a cylindrical dielectric barrier arranged in-between, the surface-modifying reactant 44, resp., the layer-detaching reactant 45 passing through the cylindrical space between the electrodes of the first/second supply device 42, 43 when they are supplied to the contamination layer 24. In this case, inert gases such as e.g. $N_2$, Ar, He, Xe, . . . can be added to the plasma as a carrier gas in order to increase the energy of the ions or free radicals in the plasma and, consequently, their momentum transfer to the material of the contamination layer 24.

When the surface modification step uses oxygen as the surface-modifying reactant 44, the oxygen may be supplied to the contamination layer 24 via the first supply device 42 as a gas composition comprising at least one of $O_2$, $N_2O$, $H_2O$, $H_2O_2$ added to the carrier gas. For instance, the gas composition/mixture can comprise a fraction of 0.5% (vol.) to 5% (vol.) of $O_2$, resp., of the $O_2$-containing species in a (plasma) carrier gas, e.g. $N_2$ or Ar, He, Xe, . . . to form OH radicals.

When the material detachment step uses hydrogen as the material-detaching reactant 45, the hydrogen may be supplied to the contamination layer 24 via the second supply device 43 as a gas composition comprising at least one of $H_2$, $NH_3$ or hydrocarbons added to the carrier gas. For instance, the gas composition/mixture may comprise a fraction of 5% (vol.) to 50% (vol.) of $H_2$, resp., of the $H_2$-containing species in a (plasma) carrier gas, e.g. $N_2$ or Ar, He, Xe, . . . to form H radicals.

In particular in the layer detachment step, an Ar—$H_2$ plasma or a $N_2$—$H_2$ plasma can be used to detach the contaminating materials of the contamination layer 24. Instead of using hydrogen $H_2$ as the reactant 45, oxygen $O_2$ may be used as the reactant 45 in the layer detachment step, in particular when an organic compound is used as the surface-modifying reactant in the surface-modifying step.

As an alternative or in addition to using a plasma for assisting the surface modification step and the material detachment step, it is also possible during the performance of a respective step to change the temperature T to promote a reaction that is desired in the respective step (e.g. with a greater surface energy) or to suppress a reaction that is undesired in the respective step (e.g. with a lower surface energy). The desired reaction can be, for example, the formation or the evaporation of a volatile hydride, the undesired reaction can be e.g. an undesired secondary reaction such as the diffusion of hydrogen into the Mo and Si layers of the multilayer coating 23, which can here result in the formation of blisters which may cause a layer detachment of individual layers of the multilayer coating 23. The surface energy of metallic tin (Sn) according to literature is approximately 0.6-0.7 $J/m^2$, cf. e.g. L. Vitos et al., "The surface energy of metals", Surface Science 411 (1998), 186. It is more difficult to find a value in literature for the surface energy of metal oxides, specifically of tin oxide, because typically indicated is the surface energy of indium tin oxide (ITO), which is between approximately 46 $mJ/m^2$ and 64 $mJ/m^2$, cf. J. S. Kim, et al., "Surface energy and polarity of treated indium-tin-oxide anodes for polymer light-emitting diodes studied by contact-angle measurements", J. Appl. Phys. 86, (1999) 2774.

Figure 4:
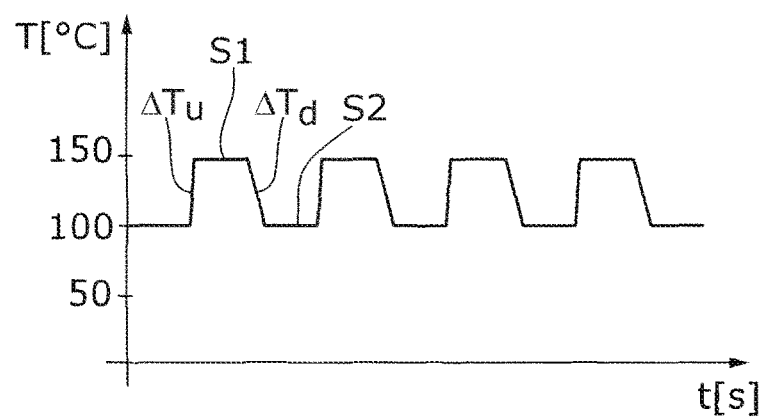
FIG. 4 shows a schematic illustration of an exemplary temperature profile of the spatial atomic layer etching process of FIG. 3.

In order to support a desired reaction or suppress an undesired reaction in the spatial atomic layer etching process shown in FIG. 3, it is necessary to quickly switch the temperature T between the two steps, such that the temperature T substantially remains constant in a respective step. FIG. 4 shows the time profile of the temperature T, which is comparatively great in the first step S1, i.e. the surface modification step (shown here to be approximately 150° C.), while the temperature T in the second step S2, i.e. the material detachment step, is comparatively low (shown here to be approximately 100° C., preferably lower than approximately 100° C.).

As can likewise be seen in FIG. 4, the temperature T very rapidly increases and decreases between the two steps S1, S2, i.e. a temperature change $\Delta T_u$ takes place at a rate that is more than approximately +100 K/s during the transition from the second step S2 to a subsequent first step S1, while the temperature change $\Delta T_d$ during the transition from the first step S1 to the subsequent second step S2 is more than approximately −50 K/s. The temperature change $\Delta T_u$, $\Delta T_d$ ideally takes place synchronously with the supply of the surface-modifying reactant 44 and the material-detaching reactant 45, respectively, i.e. directly before and after the supply. The temperature change $\Delta T_u$, $\Delta T_d$ can be effected by way of suitable heating and/or cooling apparatuses which are mounted on the atomic layer etching head 41, as is described for example in DE 10 2014 222 534 A1, which is described further above. The heating apparatus can be, for example, a radiant heater, while the cooling apparatus can be, for example, a Peltier element.

In particular in the case of spatial atomic layer etching, it has proven advantageous if, in place of heat transfer by radiant heating, conductive heat transfer takes place, in which the gaseous surface-modifying reactant 44 is heated and the layer-detaching reactant 45 is cooled, or not heated, or vice versa. Due to the small distance between the atomic layer etching head 41 and the contamination layer 24 it is possible due to a heat transfer based on conduction to achieve high rates of temperature change $\Delta T_u$, $\Delta T_d$. In this case it can be in particular advantageous if the reactants 44, 45 contain He or $H_2$, because these are gases having the highest heat capacity. The gases, or streams of gas, having the reactant 44, 45 can be heated for example by way of heating devices in the form of metallic heating coils 49, which surround the gas inlets at the supply devices 42, 43, as is illustrated in FIG. 3.

It is to be understood that the quick temperature change described further above is not limited to the atomic layer etching head 41, described in FIG. 3, for spatial atomic layer etching, but can also be performed in the conventional atomic layer etching process described in connection with FIG. 2. It is likewise to be understood that the reactants oxygen ($O_2$) and hydrogen ($H_2$) described in connection with FIG. 2 or other reactants 44, 45 can also be used in the atomic layer etching head 41 illustrated in FIG. 3. Instead of the reflective optical element 14, illustrated in FIG. 2 and FIG. 3, having a reflective multilayer coating 23, it is also possible to remove a respective contamination layer 24 from other reflective optical elements, for example from what are known as "grazing-incidence" mirrors, which have a reflective coating that may consist only of a single layer.

In summary, it is possible in the manner described further above to remove contaminations from the optical surfaces 14*a* of reflective optical elements 14, in particular mirrors, by removing said contaminations by way of evaporating etching, specifically using the ALE method, which is also referred to as "reverse atomic layer deposition" and in which repeated surface modification steps and material detachment steps are performed, for example in the form of oxidation-reduction cycles. The atomic layer etching process is preferably performed as a spatial atomic layer etching process, since the latter makes possible short process times and low process costs. However, if the process speed is non-critical, the cyclic atomic layer etching process can also be performed as a conventional atomic layer etching process, i.e. using the temporal separation of the surface modification step and the material detachment step described in connection with FIG. 2 (between which a purging or cleaning step is typically performed).

What is claimed is:

1. Method for at least partially removing a contamination layer from an optical surface of an optical element that reflects extreme ultraviolet (EUV) radiation, comprising:
   taking the optical element from a selected optical arrangement, in which the optical surface of the optical element is exposed to EUV radiation, into a process chamber of an atomic layer etching apparatus, which process chamber is external to the selected optical arrangement;
   subsequent to said taking step, performing an atomic layer etching process in the process chamber, for at least partially removing the contamination layer from the optical surface, wherein said performing step comprises:
      in a surface modification step, exposing the contamination layer to a surface-modifying reactant, and
      in a material detachment step, exposing the contamination layer to a material-detaching reactants, and
   wherein at least one of said surface modification step and said material detachment step is plasma-assisted; and
   subsequent to said performing step, installing the optical element in a further optical arrangement.

2. Method according to claim 1, wherein the selected optical arrangement is the further optical arrangement.

3. Method according to claim 1, wherein said taking step comprises removing the optical element from an EUV lithography system in which the optical surface of the optical element is exposed to the EUV radiation.

4. Method according to claim 3, wherein said installing step comprises installing the optical element in a further EUV lithography system, in which the optical surface of the optical element is exposed to the EUV radiation.

5. Method according to claim 1, wherein the atomic layer etching process comprises a spatial atomic layer etching process.

6. Method according to claim 1, wherein the contamination layer contains at least one chemical element selected from the group comprising: Zn, Sn, P, As, B, Si, In, Pb, Mg, Na, Ge, Cu, Ag, and Au.

7. Method according to claim 1, wherein the contamination layer is at least partially removed from a capping layer of a reflective coating forming the optical surface of the reflective optical element.

8. Method according to claim 1, wherein, in said surface modification step, the surface-modifying reactant comprises at least one of a hydrocarbon and a halogen, and wherein, in said material detachment step, the material-detaching reactant comprises hydrogen ($H_2$).

9. Method according to claim 8, wherein, in said surface modification step, the surface-modifying reactant comprises at least one of chlorine, arsenic and boron.

10. Method according to claim 1, further comprising generating the plasma in an atomic layer etching head.

11. Method according to claim 10, wherein said generating comprises generating the plasma at a pressure between 100 mbar and 2000 mbar.

12. Method according to claim 10, wherein the plasma is generated in a dielectric barrier discharge plasma source of the atomic layer etching head.

13. Method according to claim 1, wherein, in said surface modification step, the surface-modifying reactant comprises oxygen ($O_2$) supplied to the contamination layer as a gas composition comprising at least one of $O_2$, $N_2O$, $H_2O$, $H_2O_2$ added to a carrier gas.

14. Method according to claim 1, wherein, in said material detachment step, the material-detaching reactant, comprises hydrogen ($H_2$) supplied to the contamination layer as a gas composition comprising at least one of $H_2$, $NH_3$ or hydrocarbons added to a carrier gas.

15. Method according to claim 1, further comprising producing a temperature change ($\Delta T_u$, $\Delta T_d$) between said surface modification step and said material detachment step.

16. Method according to claim 15, wherein the temperature change ($\Delta T_u$, $\Delta T_d$) between said surface modification step and said material detachment step is greater than +/−100 K/s.

17. Method for at least partial removing a contamination layer from an optical surface of an optical element that reflects extreme ultraviolet (EUV) radiation, comprising:
taking the optical element from a selected optical arrangement, in which the optical surface of the optical element is exposed to EUV radiation, into a process chamber of an atomic layer etching apparatus, which process chamber is external to the selected optical arrangement;
subsequent to said taking step performing, an atomic layer etching process in the process chamber, for at least partially removing the contamination layer from the optical surface, wherein said performing step comprises:
in a surface modification step, exposing the contamination layer to a surface-modifying reactant, and
in a material detachment step, exposing the contamination layer to a material-detaching reactant, wherein, in said surface modification step, the surface-modifying reactant comprises oxygen ($O_2$) and wherein, in said material detachment step, the material-detaching reactant comprises hydrogen ($H_2$); and
subsequent to said performing step, installing the optical element in a further optical arrangement.

18. Method for at least partially removing a contamination layer from an optical surface of an optical element that reflects extreme ultraviolet EUV radiation, comprising:
taking the optical element from a selected optical arrangement, in which the optical surface of the optical element is exposed to EUV radiation, into a process chamber of an atomic layer etching apparatus, which process chamber is external to the selected optical arrangement;
subsequent to said taking step, performing an atomic layer etching process in the process chamber, for at least partially removing the contamination layer from the optical surface, wherein said performing step comprises:
in a surface modification step, exposing the contamination layer to a surface-modifying reactant, and
in a material detachment step, exposing the contamination layer to a material-detaching reactant,
wherein, in said surface modification step, the surface-modifying reactant comprises an organic compound, and wherein, in the material detachment step, the material-detaching reactant comprises oxygen ($O_2$)); and
subsequent to said performing step, installing the optical element in a further optical arrangement.

19. Method according to claim 18, wherein the organic compound comprises acetylacetone.

20. Method for at least partially removing a contamination layer from an optical surface of an optical element that reflects extreme ultraviolet (EUV) radiation, comprising:
taking the optical element from a selected optical arrangement in which the optical surface of the optical element is exposed to EUV radiation;
subsequent to said taking step, performing an atomic layer etching process for at least partially removing the contamination layer from the optical surface,
wherein said performing step comprises:
in a surface modification step, exposing the contamination layer to a surface-modifying reactant, and
in a material detachment step, exposing the contamination layer to a material-detaching reactant; and
subsequent to said performing step, installing the optical element in a further optical arrangement,
wherein either: (i) in said surface modification step, the surface-modifying reactant comprises oxygen ($O_2$) and, in said material detachment step, the material-detaching reactant comprises hydrogen ($H_2$),
or (ii) in said surface modification step, the surface-modifying reactant comprises an organic compound and, in said material detachment step, the material-detaching reactant comprises oxygen ($O_2$).

21. Method according to claim 20, wherein the organic compound comprises acetylacetone.

22. Method for at least partially removing a contamination layer from an optical surface of an optical element that reflects extreme ultraviolet (EUV) radiation, comprising:
taking the optical element from a selected optical arrangement in which the optical surface of the optical element is exposed to EUV radiation;
subsequent to said taking step, performing an atomic layer etching process for at least partially removing the contamination layer from the optical surface, wherein said performing step comprises:
in a surface modification step, exposing the contamination layer to a surface-modifying reactant, and
in a material detachment step, exposing the contamination layer to a material-detaching reactant,
wherein at least one of said surface modification step and said material detachment step is plasma-assisted;
generating the plasma in a dielectric barrier discharge plasma source of an atomic layer etching head,
wherein said generating step comprises generating the plasma at a pressure between 100 mbar and 2000 mbar; and
subsequent to said performing step, installing the optical element in a further optical arrangement.

23. Method for at least partially removing a contamination layer from an optical surface of an optical element that reflects extreme ultraviolet (EUV) radiation, comprising:
taking the optical element from a selected optical arrangement in which the optical surface of the optical element is exposed to EUV radiation;
subsequent to said taking step, performing an atomic layer etching process for at least partially removing the contamination layer from the optical surface, wherein said performing step comprises:
in a surface modification step, exposing the contamination layer to a surface-modifying reactant, and
in a material detachment step, exposing the contamination layer to a material-detaching reactant; and
producing a temperature change ($\Delta T_u$, $\Delta T_d$) between said surface modification step and said material detachment step; and subsequent to said performing step, installing the optical element in a further optical arrangement.

* * * * *

UNITED STATES PATENT AND TRADEMARK OFFICE
CERTIFICATE OF CORRECTION

PATENT NO. : 11,199,363 B2
APPLICATION NO. : 16/734650
DATED : December 14, 2021
INVENTOR(S) : Roozeboom et al.

Page 1 of 1

It is certified that error appears in the above-identified patent and that said Letters Patent is hereby corrected as shown below:

In the Specification

Column 8, Line 59, Delete "DPD" and insert -- DBD --.

In the Claims

Column 18, Line 24, In Claim 1, delete "reactants," and insert -- reactant --.

Column 19, Line 16, In Claim 17, delete "partial" and insert -- partially --.

Column 19, Line 26, In Claim 17, delete "performing," and insert -- performing --.

Column 19, Line 44, In Claim 18, delete "EUV" and insert -- (EUV) --.

Column 19, Line 56, In Claim 18, delete "contamin-" and insert -- contami- --.

Column 19, Line 63, In Claim 18, delete "));" and insert -- ); --.

Signed and Sealed this
Second Day of May, 2023

Katherine Kelly Vidal
*Director of the United States Patent and Trademark Office*